(12) United States Patent
Nguyen et al.

(10) Patent No.: US 7,764,885 B2
(45) Date of Patent: *Jul. 27, 2010

(54) ASYMMETRIC RISE/FALL TIME AND DUTY CYCLE CONTROL CIRCUIT

(75) Inventors: The'Linh Nguyen, San Jose, CA (US); Timothy G. Moran, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 785 days.

This patent is subject to a terminal disclaimer.

(21) Appl. No.: 11/626,081

(22) Filed: Jan. 23, 2007

(65) Prior Publication Data

US 2008/0079490 A1    Apr. 3, 2008

Related U.S. Application Data

(60) Provisional application No. 60/827,239, filed on Sep. 28, 2006.

(51) Int. Cl.
*H04B 10/00* (2006.01)

(52) U.S. Cl. ............... 398/135; 398/183; 398/195; 398/194; 398/164; 398/136; 385/88; 385/89; 385/90; 385/92; 385/93; 372/34; 372/38.02; 372/38.07

(58) Field of Classification Search ............ 398/135, 398/136, 137, 138, 139, 128, 130, 202, 182, 398/183, 186, 192, 193, 194, 208, 158, 159, 398/163, 164, 195, 196, 197, 198; 385/89, 385/90, 92, 93, 88; 372/34, 36, 38.02, 29.015, 372/38.07, 32

See application file for complete search history.

(56) References Cited

U.S. PATENT DOCUMENTS

| 5,896,408 | A | 4/1999 | Corzine et al. |
| 6,373,346 | B1 | 4/2002 | Kobayashi |
| 6,532,245 | B1 | 3/2003 | Paschal et al. |
| 6,618,406 | B1 | 9/2003 | Kaminishi |
| 6,920,163 | B2 | 7/2005 | Ishii |
| 7,580,434 | B2 * | 8/2009 | Nguyen .............. 372/38.02 |
| 2005/0052070 | A1 | 3/2005 | Kim et al. |
| 2006/0153507 | A1 | 7/2006 | Togami et al. |
| 2007/0031153 | A1 * | 2/2007 | Aronson et al. ......... 398/138 |

OTHER PUBLICATIONS

U.S. Appl. No. 11/863,098, filed Oct. 30, 2008.

* cited by examiner

*Primary Examiner*—Hanh Phan
(74) *Attorney, Agent, or Firm*—Workman Nydegger

(57) ABSTRACT

Modules and signal control circuits configured to at least partially compensate for or adjust for asymmetric rise/fall time. The circuit may include a first input node configured to receive a first data signal and a second input node configured to receive a second data signal that is complementary of the first data signal. The circuit may also include a first stage having a first node coupled to the first input node and a second node coupled to the second input node and a second stage having a first node coupled to a third node of the first stage and a second node coupled to a fourth node of the first stage. The second stage may be configured to drive a load such as a laser. The circuit may further include a third input node configured to receive a third data signal and a fourth input node configured to receive a fourth data signal that is the complementary of the third data signal. Additionally, a control stage having a first node coupled the third input node, having a second node coupled to the fourth input node, having a third node coupled to the third node of the first stage and having a fourth node coupled to the fourth node of the first stage.

22 Claims, 4 Drawing Sheets

ASYMMETRIC RISE/FALL TIME AND DUTY CYCLE CONTROL CIRCUIT

CROSS-REFERENCE TO RELATED APPLICATIONS

This application claims the benefit of U.S. Provisional Application No. 60/827,239, filed Sep. 28, 2006, which is incorporated herein by reference in its entirety.

BACKGROUND

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The electro-optic transducer emits light when current is passed there through, the intensity of the emitted light being a function of the current magnitude through the transducer. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

Various other components are also employed by the optical transceiver to aid in the control of the optical transmit and receive components, as well as the processing of various data and other signals. For example, such optical transceivers typically include an electro-optic transducer driver (e.g., referred to as a "laser driver" when used to drive a laser signal) configured to control the operation of the optical transmitter in response to various control inputs. The optical transceiver also generally includes an amplifier (e.g., often referred to as a "post-amplifier") configured to perform various operations with respect to certain parameters of a data signal received by the optical receiver. A controller circuit (hereinafter referred to as the "controller") controls the operation of the laser driver and post-amplifier.

During the operation of the optical transceiver, it is often important to evaluate the quality of a transmitted data signal. One tool often used to help in the evaluation process is an eye diagram or pattern. As is well known, an eye diagram is a graph illustrating, in one example, power output as a result of AC modulation. For example, a constant AC signal, such as a digital square wave at a given frequency, is used to modulate a laser. In one example, high values of the digital square wave correspond to logical 1s, while low values of the digital square wave correspond to logical 0s. The power output of the laser diode is then graphed for an integer multiple of a cycle as a function of time. Successive integer multiple of the cycle of the power output are graphed and overlaid on one another. This process provides a visual depiction of the area in which one could expect to find a high (logical 1) or low (logical 0) power output. The eye diagram can be used to quantify characteristics such as rise time, fall time, jitter, and overshoot.

As mentioned, the eye diagram may be used to measure the rise and fall time of the signal. In an ideal case, the rise and fall time of the measured signal are equal. In other words, the signal transitions form high to low or from low to high at the same rate. However, due to inherent non-linearity in most lasers, the rise time as measured on the eye diagram is faster than the fall time or the fall time is faster than the rise time. This asymmetric rise/fall time often causes signal distortion to occur.

For example, if the optical signal transitions too quickly from high to low, the optical signal may undershoot the low optical intensity used to represent the logical zero (hereinafter also referred to as the "baseline low optical intensity"). This increases the amount of time needed for the optical signal to settle to the baseline low optical intensity. If the optical intensity undershoots too far, the laser may even turn off thereby significantly increasing the settling time. If the next transition from low to high is within this settling time, the optical intensity may be above or below the baseline low optical intensity. This means that next transition from low to high may occur sooner or later than desired. Accordingly, jitter is introduced into the optical signal sequence.

If the optical signal transitions too quickly from low to high, the optical signal may overshoot the high optical intensity used to represent the logical one (hereinafter also referred to as the "baseline high optical intensity"). Once again, settling time is increased thereby introducing the potential for jitter.

The overshoot and undershoot problems discussed above may also have other undesirable effects. For example, before the electrical signal is converted into the optical signal, the existence of overshoot and undershoot may cause the emission of electromagnetic interference, thereby potentially adversely affecting the performance of the telecommunications system as a whole.

The eye diagram may also be used to observe the duty cycle or cross-point of the output signal. The cross-point is the point on the eye diagram where the transitions from high to low and low to high intersect. For example, the digital low is often represented by a 0 volt signal and the digital high is represented by a 1 volt signal. Accordingly, in an ideal system, the cross-point would be observed at 0.5 volts. This would mean that the duty cycle of the output signal was 50%, i.e., 50% of the time the signal was in a high state above the 50% percent cross-point and 50% of the time the signal was in a low state below the 50% cross-point.

However, due to the asymmetric rise/fall time discussed previously and other factors, the output signal often does not exhibit a 50% duty cycle. For example, if the rise time is faster than the slow time, the transition from low to high may occur prior to the 50% cross-point, thus having the signal remain in a high state for more than 50% of the signal cycle. When the fall time is faster than the rise time, the transition from low to high may occur prior to the 50% cross-point, thus having the signal remain in a low state for more than 50% of the signal cycle. Such duty cycle distortion often leads to signal distortion.

Accordingly, it would be advantageous to have mechanisms to compensate for asymmetric rise/fall time and duty cycle distortion.

BRIEF SUMMARY

Embodiments disclosed herein relate to modules and signal control circuits configured to at least partially compensate or adjust for asymmetric rise/fall time. The circuit may include a first input node configured to receive a first data signal and a second input node configured to receive a second data signal that is complementary of the first data signal.

The circuit may also include a first stage having a first node coupled to the first input node and a second node coupled to the second input node and a second stage having a first node coupled to a third node of the first stage and a second node coupled to a fourth node of the first stage. The second stage may be configured to drive a load such as a laser.

The circuit may further include a third input node configured to receive a third data signal and a fourth input node configured to receive a fourth data signal that is the complementary of the third data signal. Additionally, a control stage may also be included having a first node coupled the third input node, having a second node coupled to the fourth input node, having a third node coupled to the third node of the first stage and having a fourth node coupled to the fourth node of the first stage.

In some embodiments, the modules and signal control circuits additionally include a duty cycle control stage coupled to the first stage. The duty cycle control stage is configured to at least partially adjust the duty cycle of an output of a load coupled to the circuit by providing a voltage offset. The duty cycle control stage has a first output node coupled to the first input node, a second output node coupled to the second input node, a first duty cycle control stage input node configured to receive a fifth data signal and a second duty cycle control stage input node configured to receive a sixth data signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows, and in part will be obvious from the description, or may be learned by the practice of the embodiments disclosed herein. The features and advantages of the embodiments disclosed herein may be realized and obtained by means of the instruments and combinations particularly pointed out in the appended claims. These and other features of the embodiments disclosed herein will become more fully apparent from the following description and appended claims, or may be learned by the practice

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Embodiments disclosed herein relate to modules and signal control circuits configured to at least partially compensate or adjust for asymmetric rise/fall time. The circuit may include a first input node configured to receive a first data signal and a second input node configured to receive a second data signal that is complementary of the first data signal.

The circuit may also include a first stage having a first node coupled to the first input node and a second node coupled to the second input node and a second stage having a first node coupled to a third node of the first stage and a second node coupled to a fourth node of the first stage. The second stage may be configured to drive a load such as a laser.

The circuit may further include a third input node configured to receive a third data signal and a fourth input node configured to receive a fourth data signal that is the complementary of the third data signal. Additionally, a control stage having a first node coupled the third input node, having a second node coupled to the fourth input node, having a third node coupled to the third node of the first stage and having a fourth node coupled to the fourth node of the first stage may also be included.

In some embodiments, the modules and signal control circuits additionally include a duty cycle control stage coupled to the first stage. The duty cycle control stage is configured to at least partially adjust the duty cycle of an output of a load coupled to the circuit by providing a voltage offset. The duty cycle control stage has a first output node coupled to the first input node, a second output node coupled to the second input node, a first duty cycle control stage input node configured to receive a fifth data signal and a second duty cycle control stage input node configured to receive a sixth data signal.

I. Operating Environment

Figure 1:
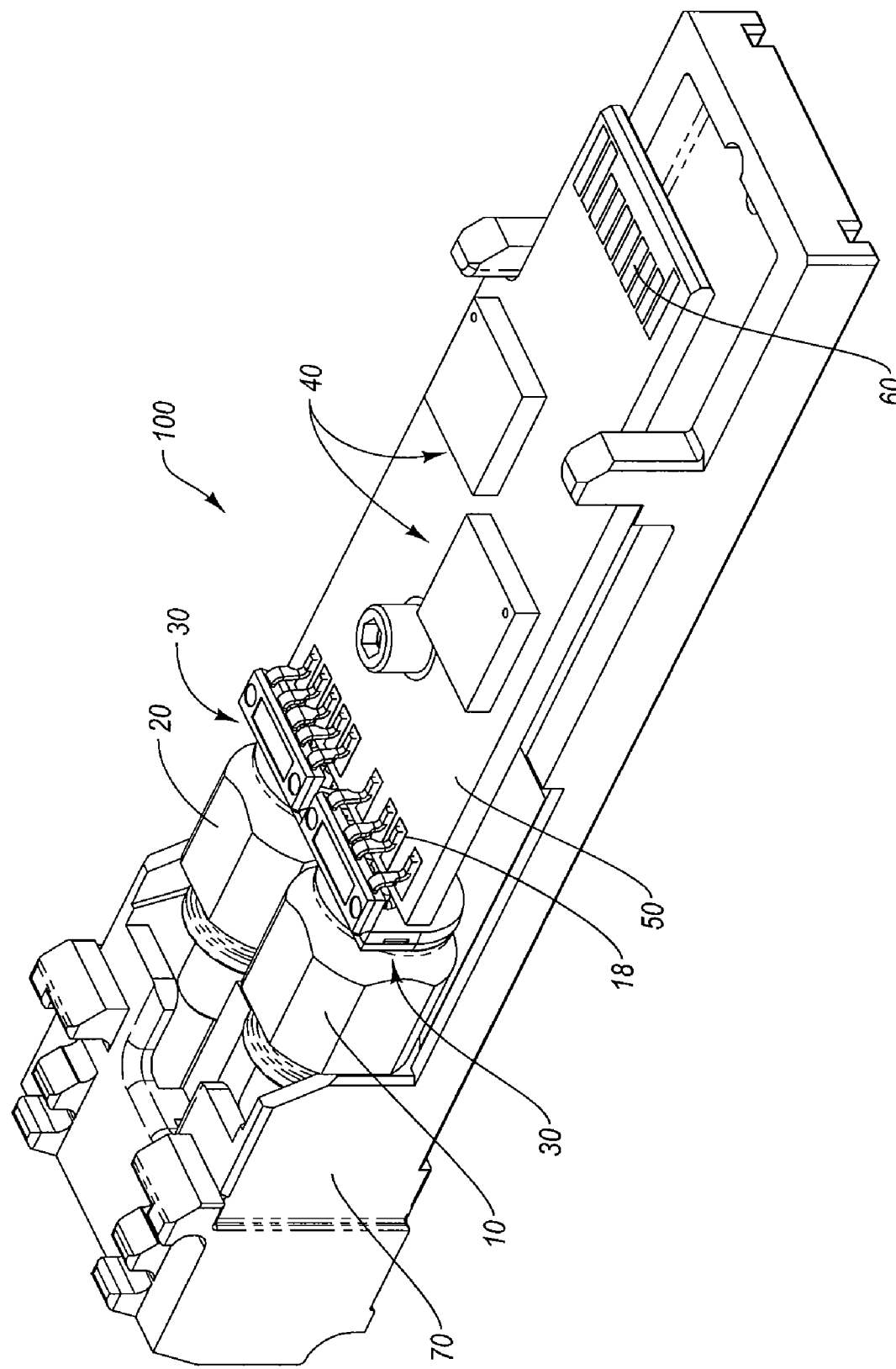
FIG. 1 is a perspective view of an example of an optical transceiver module.

Reference is first made to FIG. 1, which depicts a perspective view of an example optical transceiver module ("transceiver"), generally designated at 100, for use in transmitting and receiving optical signals in connection with an external host (not shown here) that is operatively connected, in one embodiment, to a communications network. As shown, the transceiver of FIG. 1 includes various components, including a Receiver Optical Subassembly ("ROSA") 10, a Transmitter Optical Subassembly ("TOSA") 20, electrical interfaces 30, various electronic components 40, such as a laser-driver/a post-amplifier and control module for example, and a printed circuit board 50 which supports the electronic components 40.

In the illustrated embodiment, two electrical interfaces 30 are included in the transceiver 100, one each used to electrically connect the ROSA 10 and the TOSA 20 to a plurality of conductive pads 18 located on the PCB 50. The electronic components 40 are also attached to the PCB 50. An edge connector 60 is located on an end of the PCB 50 to enable the transceiver 100 to electrically and mechanically interface with an external host 111. In addition, the above-mentioned components of the transceiver 100 are partially housed within a housing 70. Though not shown, some embodiments include a shell that cooperates with the housing 70 to define an enclosure for components of the transceiver 100.

Figure 2:
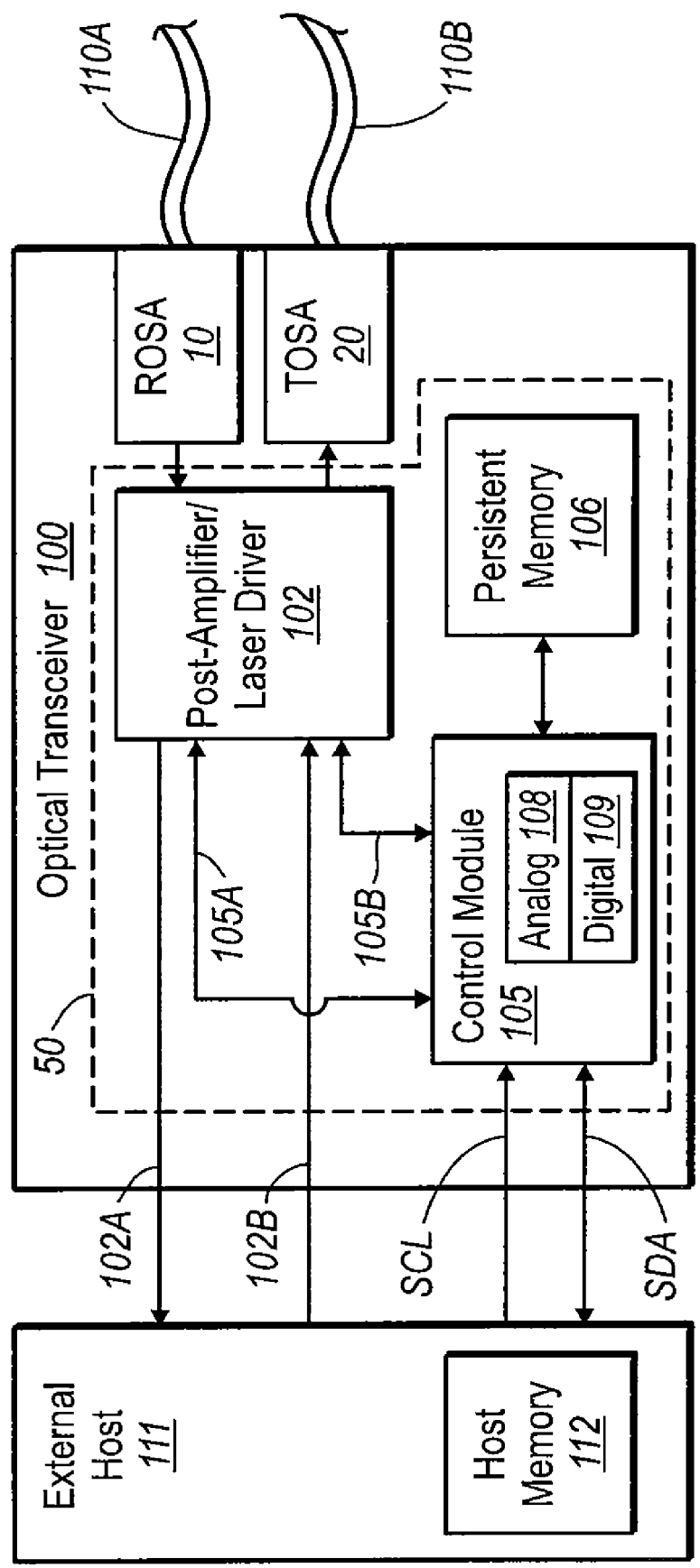
FIG. 2 is a simplified block view showing various aspects of the optical transceiver module of FIG. 1.

Reference is now made to FIG. 2, which is a simplified block diagram of an example of an optical transceiver, denoted at 100 in FIG. 1, depicting various physical and operational aspects of the transceiver. While the optical transceiver 100 will be described in some detail, the optical transceiver 100 is described by way of illustration only, and not by way of restricting the scope of the invention. As mentioned above, the optical transceiver 100 in one embodiment is suitable for optical signal transmission and reception at a variety of per-second data rates, including 1 Gbit/s, 2 Gbit/s, 4 Gbit/s, 10 Gbit/s, as well as even higher data rates. Furthermore, the embodiments described herein can be implemented in optical transceivers conforming with any of a variety of different form factors, examples of which include, but are not limited to, XFP, SFP and SFF, as well as a variety of different communication protocols, examples of which include, but are not limited to, GiGE, SONET, and Fibre Channel.

With continuing reference to FIG. 2, and with reference as well to FIG. 1, transceiver 100 includes printed circuit board ("PCB") 50 on which the various electronic components of the transceiver are mounted. One such component is a control module 105. Control module 105 is connected to an integrated laser driver/post-amplifier ("LDPA") 102 by connections 105A and 105B. These connections allow control module 105 to monitor the operation of the LDPA 102 as will be described in more detail to follow. Control module 105 is connected to a persistent memory 106, which stores microcode for configuring control module 105 and is also used to store operational parameters. The control module 105 is also able to communicate with an external host 111 as depicted by the Serial Data line (SDA) and Serial Clock line (SCL).

Transceiver 100 includes both a transmit path and a receive path, both of which will now be described. The receive path includes ROSA 10, which transforms an incoming optical data signal into an electrical data signal. The electrical data signal is then provided to a post-amplifier portion of LDPA 102. The post-amplifier amplifies and otherwise processes the electrical data signal and provides the electrical data signal to the external host 111 via connection 102A.

For the transmit path, external host 111 generates an electrical data signal and provides the electrical data signal to a laser driver portion of LDPA 102 via connection 102B. The laser driver processes the electrical data signal and drives the TOSA 20, which causes the TOSA 20 to emit an optical data signal.

The operation of transceiver 100 will now be described in further detail. In operation, the optical transceiver 100, receives an optical data signal from a fiber 110A via the ROSA 10 in manner to be described more fully below. The ROSA 10 transforms the received optical data signal into an electrical data signal. The ROSA 10 then provides the resulting electrical data signal to a post-amplifier. In the illustrated embodiment, the post amplifier is consolidated with the laser driver as an integrated LDPA 102. As such, the LDPA 102 resides on a single integrated circuit chip and is included as a component, together with the other electronic components 40, some of which are further described below, on PCB 50. In other embodiments, the post amplifier and laser driver are implemented as separate components on the PCB 50.

The post-amplifier portion of the LDPA 102 amplifies the received electrical data signal and provides the amplified data signal to external host 111 over signal path 102A. The external host 111 may be any computing system capable of communicating with the optical transceiver 100. The external host 111 contains a host memory 112 that may be any volatile or non-volatile memory source. In one embodiment, some components of the optical transceiver 100 can reside on the host 111 while the other components of the transceiver reside on the PCB 50 separate from the host 111.

The optical transceiver 100 may also receive electrical data signals from the host 111 for transmission onto a fiber 110B. Specifically, the laser driver portion of the LDPA 102 receives the electrical data signal from the host 111 via the signal path 102B, and drives a light source within the TOSA 20. One example of a light source is a DML that causes the TOSA 20 to emit onto the fiber 110B optical data signals representative of the information in the electrical data signal provided by the host 111.

The behavior of the ROSA 10, the LDPA 102, and the TOSA 20 may vary dynamically due to a number of factors. For example, temperature changes, power fluctuations, and feedback conditions may each affect the performance of these components. Accordingly, the transceiver 100 includes a control module 105, which may evaluate environmental conditions, such as temperature, age of the laser, and/or operating conditions, such as voltage, and receive information from the post-amplifier portion of the LDPA 102 by way of connection 105A, and from the laser driver portion of the LDPA by way of connection 105B. This arrangement allows the control module 105 to optimize the performance of the laser to compensate for dynamically varying conditions.

Specifically, the control module 105 optimizes the operation of the transceiver 100 by adjusting settings on the LDPA 102 as represented by the connections 105A and 105B. These settings adjustments can be intermittent and are generally only made when temperature or voltage or other low frequency changes so warrant.

The control module 105 has access to a persistent memory 106, which in one embodiment, is an Electrically Erasable and Programmable Read Only Memory (EEPROM). Persistent memory 106 may also be any other non-volatile memory source. Persistent memory 106 is used to store microcode for configuring control module 105 and for storing operational parameters that have been measured by the control module 105. The persistent memory 106 and the control module 105 may be packaged together in the same package or in different packages without restriction.

Data and clock signals may be provided from the host 111 to the control module 105 using the SDA and SCL lines respectively. Also data may be provided from the control module 105 to the host 111 to allow for transmitting diagnostic data such as environmental and/or operational parameters. The control module 105 includes both an analog portion 108 and a digital portion 109. In this example, the analog portion 108 and the digital portion 109 collectively enable the control module to implement logic digitally, while still largely interfacing with the rest of the optical transceiver 100 using analog signals.

II. Example Embodiment of a Signal Control Circuit

Figure 3:
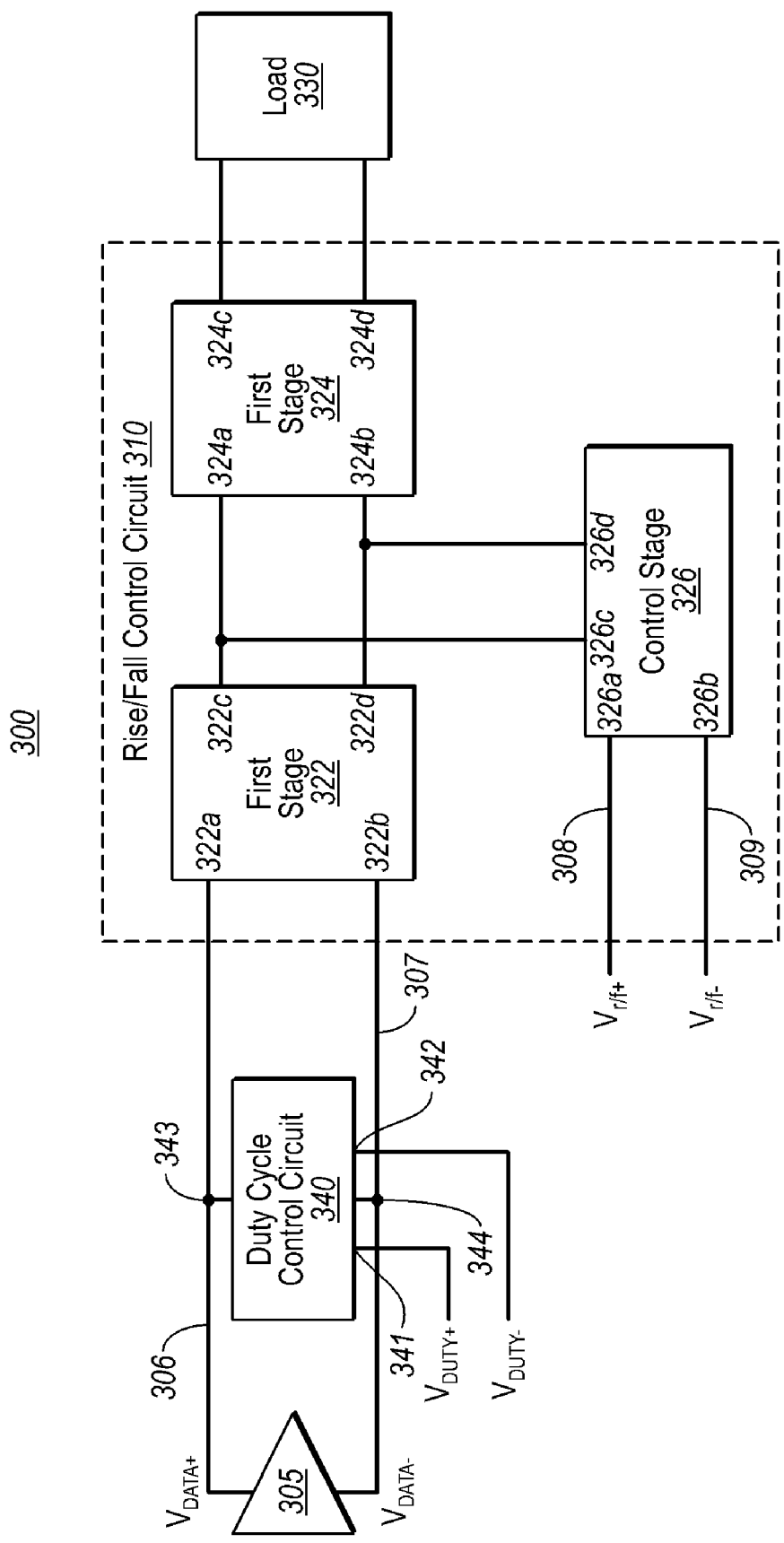
FIG. 3 is a block diagram of a signal control circuit in accordance with the principles of the present invention.

FIG. 3 illustrates an example circuit or stage 300 configured to adjust the duty cycle and/or rise/fall time of the signal into a load such as a laser in TOSA 20. Circuit 300 may correspond to a portion of the laser driver previously described in relation to FIG. 2, although this is not required. Note that although various components are illustrated as comprising circuit 300, it should be understood that this is for illustration only. The embodiments disclosed herein contemplate a circuit 300 with additional components not illustrated in FIG. 3. Also note that the reference to a first, second, third, etc. component (such as a transistor) in this description and in the claims is not intended to imply any sequential listing and is merely intended to distinguish one component from another.

As mentioned previously, a measured eye diagram of an output signal of a laser or other optical signal emitter may often show a rise or fall time that is not desired. For example, in some instances the rise time of the output signal may be faster than the fall time. In other instances the fall time may be faster than the rise time. For increased laser performance, it is often necessary to compensate for or adjust the rise or fall time of the laser. For example, if the rise time is faster than fall time, then it would be desirable to slow down the rise time and speed up the fall time. The opposite would be true in cases where fall time were faster than the rise time.

Accordingly, circuit 300 includes a rise/fall time control circuit 310 that is configured to allow a user to adjust the rise and/or fall time of an output signal of a load. As illustrated, rise/fall time control circuit 310 includes three stages that are configured to help rise/fall time control circuit 310 perform its function. Note, however, that rise/fall time control circuit 310 may also include additional stages or fewer stages as circumstances require.

As illustrated in FIG. 3, rise/fall time control circuit 310 includes a first stage 322. First stage 322 includes a first node 322a that is coupled to a first input node 306 and a second node 322b that is coupled to a second input node 307. As shown, first input node 306 is configured to receive a first data signal (Vdata+) from a pre-driver stage 305 and second input node 307 is configured to receive a second data signal that is complementary of the first data signal (Vdata−) from pre-driver stage 305. Note that in some embodiments, first stage 322 may receive a single ended signal.

Rise/fall time control circuit 310 also includes a second stage 324. Second stage 324 includes a first node 324a coupled to a third node 322c of the first stage 322 for receiving the first data signal Vdata+. A second node 324b is coupled to a fourth node 322d of the first stage for receiving the second data signal Vdata−. Third and fourth nodes 324c and 324d are configured to be coupled to a load 330. In operation, third and fourth nodes 324c and 324d drive load 330 by providing the first and second data signals to the load 330. In the present embodiment, the load 330 is represented as laser, such as a directly modulated laser ("DML"), although in other embodiments the load can include other types of optical emitters.

Rise/fall time circuit 310 further includes a control stage 326. Control stage 326 includes input nodes 326a and 326b that are coupled to a third input node 308 and a fourth input node 309 respectively. As shown, third input node 308 is configured to receive a third data signal (Vr/f+) while fourth input node 309 is configured to receive a fourth data signal that is complementary of the third data signal (Vr/f−). Output node 326c is coupled to third node 322c and first node 324a while output node 326d is coupled to fourth node 322d and second node 324b.

In operation, control stage 326 allows a user to at least partially control or affect the amount of current provided to nodes 322c and 322d of first stage 322. Varying the amount of current provided to the first stage 322 affects the signal provided to second stage 324, which may cause an adjustment of the rise/fall time of the output signal of load 330 to occur. For example, adjusting the current provided to the first stage 322 may slow down the rise time and speed up the fall time or speed up the fall time and slow down the rise time. This process will be described in more detail to follow in relation to FIG. 4

As discussed previously, the measured eye diagram of the output signal of the load may also display duty cycle distortion. As mentioned, it is desirable for the output signal to have a cycle wherein the signal is high or above a 50% cross-point for 50% of the time and low or below the 50% cross-point for the other 50% of the time. Accordingly, in some embodiments circuit 300 may include a duty cycle control stage 340 coupled to the first stage 322 that is configured to at least partially adjust the duty cycle of the output signal by providing a voltage offset to the differential signals Vdata+ and Vdata−.

As illustrated, duty cycle control stage 340 includes a first input node 341 for receiving a data signal (Vduty+) and a second input node 342 for receiving a data signal (Vduty−) that is complementary of the signal Vduty+. In addition, duty cycle control stage 340 also includes a first output node 343 coupled to the first input node 306 and a second output node coupled to second input node 307.

In operation, duty cycle control circuit or stage 340 is configured to adjust the duty cycle up or down until the desired 50% duty cycle is achieved by altering the amount of current in the first data signal Vduty+ and/or the second data signal Vduty− before providing those signals to the other components of circuit 300. The current adjustment thus creates an offset or difference between the data signals. Duty cycle control stage 340 may be controlled by a user to adjust to a 50% duty cycle as will be described in more detail to follow.

III. Specific Example of a Signal Control Circuit

Figure 4:
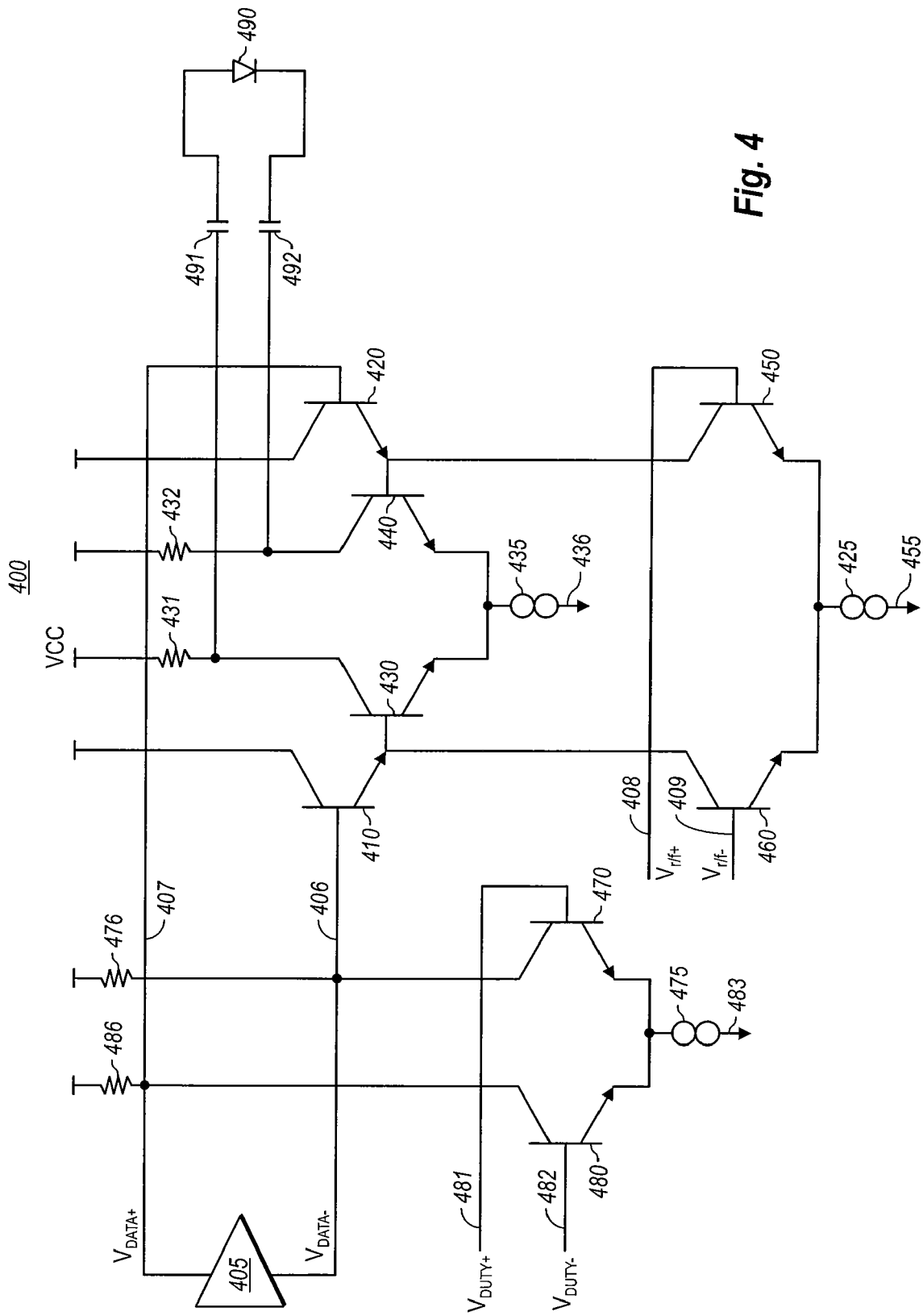
FIG. 4 is a specific embodiment of the signal control circuit of FIG. 3.

Referring now to FIG. 4, a specific embodiment of a circuit or stage 400 for providing signal control is illustrated. Note that although various components are illustrated as comprising circuit 400, it should be understood that this is for illustration only. The embodiments disclosed herein contemplate a circuit 400 with additional components not illustrated in FIG. 4. In addition, although circuit 400 illustrates bipolar transistors, FET transistors may also be used as one skilled in the art would appreciate.

The circuit 400 includes a first input node 406 and a second input node 407, both of which are configured to receive the differential signal pair Vdata+ and Vdata− from a pre-driver 405. A first bipolar transistor 410 has a base coupled to the first input node 406 and has a collector terminal that is configured to be coupled to a voltage source VCC when in operation. In similar manner, a second bipolar transistor 420 has a base terminal coupled to the second input node 407 and has a collector terminal that is configured to be coupled to the voltage source VCC when in operation. Note that first and second transistors 410 and 420 may comprise the first stage 322 of FIG. 3, although this is not required.

A third bipolar transistor 430 has a base terminal that is coupled to an emitter terminal of first bipolar transistor 410. The collector terminal of third bipolar transistor 430 is coupled to a first terminal of a series resistor 431, which has a second terminal configured to be connected to VCC when in operation. The emitter terminal of third bipolar transistor 430 is coupled to a current supply 435, which is also coupled to a ground 436. Note that current supply 435 is configured to provide biasing current to third and fourth bipolar transistors 430 and 440. Note that third and fourth transistors 430 and 440 as well as the current source 435 may comprise the second stage 324 of FIG. 3, although this is not required.

Likewise, fourth bipolar transistor 440 has a base terminal that is coupled to an emitter terminal of second bipolar transistor 420. The collector terminal of fourth bipolar transistor 440 is coupled to a first terminal of a series resistor 432, which has a second terminal configured to be connected to VCC when in operation. The emitter terminal of fourth bipolar transistor 440 is coupled to the current supply 435. In operation, the collector terminals of the third and fourth transistors 430 and 440 are configured as output nodes and are coupled to first and second terminals of the load 490, which in some embodiments is an electro-optic transducer such as a laser or LED. Accordingly, third and fourth transistors 430 and 440 are able to drive the output signal required by the load 490. Note that in some embodiments, load 490 may be AC coupled through coupling capacitors 491 and 492.

Circuit 400 further includes a third input node 408 and a fourth input node 409 that are configured to receive the differential signal pair Vr/f+ and Vr/f− respectively. A fifth bipolar transistor 450 has a base terminal coupled to the third input node 408 and an emitter terminal coupled to a second current source 425. Similarly, a sixth bipolar transistor 460 has a base terminal coupled to the fourth input node 409 and an emitter terminal coupled to the current source 425. The current source 425 couples to the emitters of bipolar transistors 460 and 450 to a ground 455. Note that fifth and sixth bipolar transistors 450 and 460, as well as the second current source 425, may comprise the control stage 326 of FIG. 3, although this is not required.

The collector terminal of fifth bipolar transistor 450 is coupled to the junction of the emitter of second bipolar transistor 420 and the base of the fourth bipolar transistor 440. The collector terminal of the sixth bipolar transistor 460 is coupled to the junction of the emitter of the first bipolar transistor 410 and the base of the third bipolar transistor 430. In operation, the amount of current that is provided to first and second bipolar transistors 410 and 420 may be varied by a user applying the differential input signal pair Vr/f+ and Vr/f− to the fifth and sixth transistors 450 and 460. This in turn causes the rise and fall time of the voltage provided by first and second bipolar transistors 410 and 420 to third and fourth bipolar transistors 430 and 440 to be different, which in turn will cause the rise and/or fall time of the output load signal to be different as will be explained in more detail to follow.

In some embodiments, circuit 400 may also include further components configured to provide duty cycle adjustment. Accordingly, circuit 400 may include fifth and sixth input nodes 481 and 482 that are configured to receive a differential signal pair Vduty+ and Vduty−. A seventh bipolar transistor 470 has a base terminal coupled to the input node 481 and an emitter terminal coupled to a third current source 475. Similarly, an eighth bipolar transistor 480 has a base terminal coupled to the input node 482 and an emitter terminal coupled to the third current source 475. Current source 475 is further coupled to a ground 483. Note that seventh bipolar transistor 470, eighth bipolar transistor 480, and current source 475 may comprise the duty cycle control stage 340 of FIG. 3, although this is not required.

The collector terminal of seventh bipolar transistor 470 is coupled to the first input node 406 and to the first terminal of a series resistor 476, which has a second terminal coupled to VCC when in operation. The collector terminal of the eighth bipolar transistor 480 is coupled to the second input node 407 and to the first terminal of a series resistor 486, which has a second terminal coupled to VCC when in operation. In operation, a voltage offset is created at the collector terminals of the seventh and eighth bipolar transistors 470 and 480, which may at least partially cause a duty cycle adjustment as will be explained in more detail to follow.

IV. Operation of a Specific Embodiment of the Signal Control Circuit

As previously mentioned, the output signal of laser 490 often displays asymmetric rise/fall time due to the non-linearity of the laser 490. For example, in some instances the rise time may be faster than the fall time and in other instances the rise time may be slower than the fall time. Both of these types of asymmetric rise/fall time are not optimal. Advantageously, the signal control circuit of the present invention is configured to at least partially adjust the rise and/or fall time to help ensure that the rise/fall time of the output signal is closer to the desired equal rise and fall time.

In operation, a differential signal (Vdata+ and Vdata−) is provided to input nodes 406 and 407 from another stage such as a pre-driver 405. The differential signal is then passed through first and second bipolar transistors 410 and 420 to third and fourth bipolar transistors 430 and 440. The differential signal at the collectors of third and fourth transistors 430 and 440 may then drive the output of laser 490.

However, if the non-linearity of laser 490 causes the need for rise/fall time adjustment, a user may apply a differential signal (Vr/f+ and Vr/f−) to the input nodes 408 and 409. Applying this differential signal has the effect of steering the amount of current provided by current sources 425 from the collector of bipolar transistor 460 to the emitter of bipolar transistor 410 or from the collector of bipolar transistor 450 to the emitter of bipolar transistor 420. For example, when the current source 425 provides the same current to the emitters of first and second transistors 410 and 420, there is no effect on the differential signal provided by these transistors to third and fourth transistors 430 and 440. However, the applied signal Vr/f+ and Vr/f− has the effect of making the current provided to the emitter of transistor 410 different from the current provided to the emitter of transistor 420. Making these two currents different will then affect how fast the signal provided by the emitter of the first transistors 410 drives the base terminal of the third transistor 430 and how fast the signal provided by the emitter of the second transistor 420 drives the base of the fourth transistors 440, which in turn effectively makes the rise time of the output signal different from its fall time.

For example, a user may measure an eye diagram of the output signal of the load 490 that shows a rise time that is faster than the fall time. In order to slow down the rise time and speed up the fall time, which will move the output signal closer to the desired equal rise time and fall time, the user may apply a differential signal Vr/f+ and Vr/f− to bipolar transistors 450 and 460 that increases the current supplied by transistor 460 to transistor 410 while decreasing the current provided by transistor 450 to transistor 440. Increasing the current supplied by transistor 460 will speed up the signal driving transistor 430, while decreasing the current supplied by transistor 450 will decrease the speed of the signal driving transistor 440. The resulting change in the signals driving transistors 430 and 440 will cause a change in the rise and fall time of signal input into laser 490, which in turn changes the rise and fall time of the output signal of the laser 490. The user may then measure the eye-diagram and determine if further adjustment is needed. If further adjustment is needed, the user may apply a different differential signal Vr/f+ and Vr/f− that increases or decreases the currents supplied by transistors 450 and 460. This process may be repeated as needed until the rise/fall time of the output signal is at a desired level.

It should be noted that the implementation of the asymmetric rise/fall time control circuit 400 described here and referenced in FIG. 4 is only an one of many possible examples which is included to facilitate the explanation of the invention. One skilled in the art can appreciate that one can adjust the emitter currents of transistors 410 and 420 independently by other means that would achieve the same results as described above. It should also be noted that neither emitter currents of transistors 410 and 420 are exclusively tied to rise time or fall time. In other words, a user does not exclusively change the current provided to the emitter of transistor 410 when desiring to change the rise time and exclusively change the current provided to the emitter of transistor 420 when desiring to change the fall time. The opposite is also true as a user does not exclusively change the current provided to the emitter of transistor 420 when desiring to change the rise time and exclusively change the current provided to the emitter of transistor 410 when desiring to change the fall time. Rather, the user changes the current provided to one or both emitters of transistors 410 and 420 as needed to change the rise time and changes the current provided to one or both emitters of transistors 410 and 420 as needed to change the fall time. Accordingly, the amount that a user will change the current supplied to either emitters of transistors 410 and 420 will vary according to the rise/fall time of the output signal.

As mentioned previously, it is desirable for the cycle of the output signal to be high or above a 50% cross-point for 50% of the time and to be low or below the 50% cross-point the other 50% of the time. However, in some instances, the output signal of laser 490 may display duty cycle distortion by remaining high or low for more than the desired 50% of the time. Advantageously, the signal control circuit of the present invention is also configured to at least partially compensate for any duty cycle distortion.

In operation, a differential input signal Vduty+ and Vduty− is applied to base terminal of transistors 470 and 480 respectively by a user desiring to adjust the duty cycle. Applying this differential signal has the effect of steering the amount of current provided by current source 475. For example, when the current in the collectors of transistors 470 and 480 are the same, no effect is seen on the differential signal Vdata+ and Vdata− at the junction of the collectors of transistors 470 and 480 and nodes 406 and 407. However, the applied signal Vduty+ and Vduty− has the effect of making the collector current of transistor 470 different from the collector current of transistor 480, which then may produce a voltage offset at the collector terminals of transistors 470 and 480. This offset may then cause the duty cycle to adjust up or down relative to the 50% cross-point as needed.

For example, suppose that Vduty+ and Vduty− are equal such that each of the transistors 470 and 480 draws 1 milliamps (mA). Further suppose that the resistors 476 and 486 were 50 ohm termination resistors. In this case an equal amount of current would be provided at the collectors and no offset would be present.

When the differential signal Vduty+ and Vduty− is applied, however, the amount of current supplied by the collectors of transistors 470 and 480 may be changed. For example, the differential signal Vdutycycle+ and Vdutycycle− may change the collector current of transistor 470 to 1.5 mA and the collector current of transistor 480 to be 0.5 mA. This difference will cause a voltage offset at the collector terminals of transistors 470 and 480. The voltage difference or offset is then provided to the transistors 410 and 420. This new difference or offset then causes the duty cycle to adjust up or down as necessary. This process may be repeated as needed until the duty cycle is at a desired level.

Continuing the above example, if 1.5 mA were provided to the collector of transistor 470, then the voltage at the node would equal this value multiplied by 50 ohm resistor 476, which is 75 mV. In similar fashion, if 0.5 mA were provided to collector of transistor 480, then the voltage at the node would be this value multiplied by 50 ohm resistor 566, which is 25 mV. The overall voltage difference or offset is 50 mV. As mentioned above, this difference or offset is then applied to the differential signal Vdata+ and Vdata− and provided to transistors 410 and 420, which in turn causes the duty cycle of the output eye to adjust up or down.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit for providing signal control comprising:
   a first input node configured to receive a first data signal;
   a second input node configured to receive a second data signal that is the complementary of the first data signal;
   a first stage having a first stage first node coupled to the first input node and a first stage second node coupled to the second input node;
   a second stage having a second stage first node coupled to a third node of the first stage and a second stage second node coupled to a fourth node of the first stage, wherein the second stage is configured to drive a load;
   a third input node configured to receive a third data signal; and
   a fourth input node configured to receive a fourth data signal that is the complementary of the third data signal; and
   a control stage having a control stage first node coupled the third input node, having a control stage second node coupled to the fourth input node, having a control stage third node coupled to the third node of the first stage and having a control stage fourth node coupled to the fourth node of the first stage.

2. The circuit in accordance with claim 1, wherein the control stage is configured to at least partially affect an amount of current provided to the first stage to thereby adjust a rise/fall time a signal input into a load coupled to the circuit.

3. The circuit in accordance with claim 1, wherein the control stage includes at least a current source, a first transistor and a second transistor, and wherein making the current supplied by the first transistor different than the current supplied by the second transistor at least partially adjusts the rise/fall time a signal input into a load coupled to the circuit.

4. The circuit in accordance with claim 1, wherein the first stage comprises:
   a first first stage bipolar transistor having a base terminal coupled to the first input node, having a collector terminal configured to be coupled to a voltage source when in operation and having a emitter terminal coupled to the first node of the second stage; and
   a second first stage bipolar transistor having a base terminal coupled to the second input node, having a collector terminal configured to be coupled to the voltage source when in operation, and having a emitter terminal coupled to the second node of the second stage.

5. The circuit in accordance with claim 1, wherein the second stage comprises:
   a first second stage transistor having a base terminal coupled to the first stage third node and having a collector terminal configured to be coupled to a voltage source;
   a second second stage transistor having a base terminal coupled to the first stage fourth node and having a collector terminal configured to be coupled to a voltage source; and
   a second stage current source coupled to an emitter of both the first second stage transistor and the second second stage transistor and to a ground, wherein the collector of the the first second stage transistor and the second second stage transistor are configured to drive the load.

6. The circuit in accordance with claim 1, wherein the control stage comprises:

a first control stage bipolar transistor having a base terminal coupled to the third input node and having a collector terminal coupled to the third node of the first stage;
a second control stage bipolar transistor having a base terminal coupled to the fourth input node and having a collector terminal coupled to the fourth node of the first stage; and
a control stage current source coupled to an emitter of both the first control stage bipolar transistor and the second control stage bipolar transistor and to a ground.

7. The circuit in accordance with claim 6, wherein making the current supplied by the first control stage bipolar transistor different than the current supplied by the second control stage bipolar transistor at least partially adjusts the rise/fall time of a signal input into a load coupled to the circuit.

8. The circuit in accordance with claim 1 further comprising:
a duty cycle control stage coupled to the first stage, wherein the duty cycle control stage is configured to at least partially adjust the duty cycle of a signal input into a load coupled to the circuit by providing a voltage offset.

9. The circuit in accordance with claim 8, wherein the duty cycle control stage has a first duty cycle control stage output node coupled to the first input node; a second duty cycle control stage output node coupled to the second input node; a first duty cycle control stage input node configured to receive a fifth data signal; a second duty cycle control stage input node configured to receive a sixth data signal.

10. The circuit in accordance with claim 9, wherein the duty cycle control stage further comprises:
a first duty cycle control stage bipolar transistor having a base terminal coupled to the first duty cycle control stage input node and having a collector terminal coupled to the first input node;
a second duty cycle control stage bipolar transistor having a base terminal coupled to the second duty cycle control stage input node and having a collector terminal coupled to the second input node; and
a first duty cycle control stage current source coupled to an emitter terminal of the first and second duty cycle control stage bipolar transistors and to a ground.

11. A circuit for providing signal control comprising:
a first input node configured to receive a first data signal;
a second input node configured to receive a second data signal that is the complementary of the first data signal;
a first bipolar transistor having a base terminal coupled to the first input node and having a collector terminal configured to be coupled to a voltage source when in operation;
a second bipolar transistor having a base terminal coupled to the second input node and having a collector terminal configured to be coupled to the voltage source when in operation;
a third bipolar transistor having a base terminal coupled to an emitter terminal of the first bipolar transistor;
a fourth bipolar transistor having a base terminal coupled to an emitter terminal of the second bipolar transistor;
a first current source coupled to an emitter terminal of both the third and fourth bipolar transistors and coupled to a first ground;
a first resistor having a first terminal configured to be coupled to a voltage source when in operation and having a second terminal coupled to a collector terminal of the third bipolar transistor, wherein the collector terminal of the third bipolar transistor is configured to act as an first output node for driving a load;
a second resistor having a first terminal configured to be coupled to a voltage source when in operation and having a second terminal coupled to a collector terminal of the fourth bipolar transistor, wherein the collector terminal of the fourth bipolar transistor is configured to act as an second output node for driving a load;
a third input node configured to receive a third data signal;
a fourth input node configured to receive a fourth data signal that is the complementary of the third data signal;
a fifth bipolar transistor having a base terminal coupled to the third input node and having a collector terminal coupled to an emitter of the second bipolar transistor and the base of the fourth bipolar transistor;
a sixth bipolar transistor having a base terminal coupled to the fourth input node and having a collector terminal coupled to an emitter of the first bipolar transistor and the base of the third bipolar transistor; and
a second current source coupled to an emitter of both the fifth bipolar transistor and the sixth bipolar transistor and to a ground.

12. The circuit in accordance with claim 11, wherein the rise/fall time of a load coupled to the first and second output nodes is at least partially adjusted by applying the third and fourth data signal to thereby make the current provided by the fifth bipolar transistor to the second bipolar transistor different from the current provided by the sixth bipolar transistor to the first bipolar transistor, the different current affecting the rise/fall time of the signal input into the load.

13. The circuit in accordance with claim 11, wherein the first and second output nodes are coupled to an electro-optic transducer.

14. The circuit in accordance with claim 11, further comprising:
a fifth input node configured to receive a fifth data signal;
a sixth input node configured to receive a sixth data signal that is complementary of the fifth data signal;
a seventh bipolar transistor having a base terminal coupled to the fifth input node and having a collector terminal coupled to the first input node and to the first terminal of a third resistor, the third resistor having a second terminal configured to be coupled to a power supply when in operation, wherein the collector terminal of the seventh bipolar transistor acts as a third output node;
an eighth bipolar transistor having a base terminal coupled to the sixth input node and having a collector terminal coupled to the second input node and to a first terminal of a fourth resistor, the fourth resistor having a second terminal configured to be coupled to a power supply when in operation, wherein the collector terminal of the eighth bipolar transistor acts as a fourth output node; and
a third current source coupled to an emitter terminal of both the seventh bipolar transistor and the eighth bipolar transistor and to a third ground.

15. The circuit in accordance with claim 14, wherein applying the fifth and sixth data signals causes a voltage offset at the third and fourth output nodes, the voltage offset at least partially adjusting the duty cycle of a load coupled to the first and second output nodes.

16. An optical transceiver module comprising:
a signal generation stage having first and second output nodes;
an electro-optic transducer having first and second input/output nodes;
a rise/fall time control stage having a first input node coupled to the first output node of the signal generation stage, a second input node coupled to the second output node of the signal generation node, a first output node coupled to the first input/output node of the electro-optic transducer and having a second output node coupled to the second input/output node of the electro-optic transducer, wherein the rise/fall time control stage is configured to at least partially adjust the rise/fall time of a signal input into the electro-optic transducer; and a duty cycle control stage having a first output node coupled to the first input node of the rise/fall time stage and having a second output node coupled to the second input node of the rise/fall time stage, wherein the duty cycle control stage is configured to at least partially adjust the duty cycle of the signal input into the electro-optic transducer.

17. The optical transceiver module in accordance with claim 16, wherein the rise/fall stage comprises:

a first input node configured to receive a first data signal;

a second input node configured to receive a second data signal that is the complementary of the first data signal;

a first stage having a first stage first node coupled to the first input node and a first stage second node coupled to the second input node;

a second stage having a second stage first node coupled to a third node of the first stage and a second stage second node coupled to a fourth node of the first stage, wherein the second stage is configured to drive the electro-optic transducer;

a third input node configured to receive a third data signal; and a fourth input node configured to a fourth data signal that is the complementary of the third data signal; and a control stage having a control stage first node coupled the third input node, having a control stage second node coupled to the fourth input node, having a control stage third node coupled to the third node of the first stage and having a control stage fourth node coupled to the fourth node of the first stage, wherein the control stage is configured to at least partially affect an amount of current provided to the first stage to thereby adjust the rise/fall time of a signal input into the electro-optic transducer.

18. The optical transceiver module in accordance with claim 16, wherein the duty cycle control stage is configured to at least partially adjust the duty cycle of the electro-optic transducer by providing a voltage offset.

19. The optical transceiver module in accordance with claim 16, wherein adjusting current levels in the rise/fall time stage at least partially adjust the rise/fall time of a signal input into the electro-optic transducer.

20. The optical transceiver module in accordance with claim 16, wherein the electro-optic transducer is one of a laser or a Light Emitting Diode (LED).

21. The optical transceiver module in accordance with claim 16, wherein the optical transceiver is one of a 1 G laser transceiver, 2 G laser transceiver, 4 G laser transceiver, 8 G laser transceiver, 10 G laser transceiver, or fiber channels greater than 10 G.

22. The optical transceiver module in accordance with claim 16, wherein the optical transceiver is one of an XFP laser transceiver, an SFP laser transceiver, or a SFF laser transceiver.

* * * * *